United States Patent [19]
Gutierrez et al.

[11] Patent Number: 5,127,571
[45] Date of Patent: Jul. 7, 1992

[54] WATER SOLUBLE SOLDERING PREFLUX AND METHOD OF APPLICATION

[75] Inventors: Barbara L. Gutierrez, Austin; Janet M. Sickler, Georgetown, both of Tex.

[73] Assignee: International Business Machines Corporation, Armonk, N.Y.

[21] Appl. No.: 785,725

[22] Filed: Oct. 31, 1991

[51] Int. Cl.⁵ .................... B23K 1/20; B23K 35/365
[52] U.S. Cl. .................................. 228/179; 228/207; 228/223; 148/23; 148/25
[58] Field of Search .............. 228/179, 207, 223; 148/23, 25

[56] References Cited

U.S. PATENT DOCUMENTS 5,009,724  4/1991  Dodd et al. .................... 228/207

FOREIGN PATENT DOCUMENTS 53-82640  7/1978  Japan .................... 228/179
2-174190  7/1990  Japan .................... 228/179
3-47694   2/1991  Japan .................... 228/179

Primary Examiner—Kurt Rowan
Assistant Examiner—Jeffrey T. Knapp
Attorney, Agent, or Firm—Charles D. Gunter, Jr.

[57] ABSTRACT

Water soluble soldering preflux compositions are shown which include gum arabic, modified polysaccharides and other natural resins as a carrier, an oxidation inhibitor and water. The compositions are useful in the assembly of precisely aligned electrical components during multiple step, electronic card assembly techniques. Use of the preflux compositions according to the method of the invention permits a flexible, site-specific method for joining electronic components to a printed circuit board with a fewer number of steps.

12 Claims, 1 Drawing Sheet

WATER SOLUBLE SOLDERING PREFLUX AND METHOD OF APPLICATION

BACKGROUND OF THE INVENTION

1. Field of the Invention

The present invention relates to water soluble preflux compositions and their use in processes for soldering members, particularly metallic members together. The preflux compositions are particularly useful in the field of microelectronics, such as in electronic card assembly where integrated circuit components are attached to circuitized substrates having surfaces to be soldered.

2. Description of the Prior Art

A common task in the manufacture of microelectronic components involves the manufacture of single chip or multi-chip modules having input/output pins which are soldered to a substrate. The input/output pins provide the needed electrical connections to the integrated circuit chip or chips which are subsequently connected to the substrate or carrier. In other presently known manufacturing processes, a chip is soldered directly to a printed circuit board. With either of the above processes, solder flux compositions are typically applied to the pins and/or substrate in order to connect the component to the selected substrate, for instance, a printed circuit board. Flux compositions are employed to remove oxides from the pins and to prevent the pins from oxidizing when subjected to elevated temperatures for soldering, thereby serving to maintain the solderability of the substrate.

In certain manufacturing processes, not all components are installed on a printed circuit board in the same process step. The unoccupied sites can become oxidized before the subsequent installation of a component in the subsequent process step. Rosin prefluxes have been used in the past to protect the surfaces to be soldered of the printed circuit board. Such prefluxes have acceptable heat resistance and maintain copper/solder solderability by protecting the surfaces to be soldered against surface degradation due to oxidation and contaminant diffusion during subsequent thermal processing. One prior art composition is a two component rosin preflux. A precoat of polymerized imidazole is applied to the conductive copper surface to provide an inhibition layer. This step is followed by the application of a heat stabilized rosin, thickness controlled.

Once solder is applied during the manufacturing process, any flux composition or residue remaining on the pins and substrates must be removed to provide as clean a substrate as possible. The soldering operation becomes increasingly difficult when applied to microelectronics. The pieces to be joined are extremely small, making cleaning, soldering, post-cleaning and inspection difficult. Cleaning and post-cleaning are difficult due to the small size of the components, their large numbers, and the potential damage to the electronics by the cleaning solutions used. Another problem source results from the fact that many of the known soldering fluxes and prefluxes are corrosive. In the environment of microelectronics, corrosion from any residual flux materials can ruin an extremely costly device.

The provision of a non-toxic, non-corrosive soldering preflux which is water cleanable holds many advantages for the microelectronics application. These properties are extremely important in microelectronics applications with low stand-off heights such as the 0.001–0.004 inch chip attach to substrate heights presently encountered.

A need exists for a preflux composition which is water soluble, or at least aqueous processable, which is heat resistant and which protects the surface to be soldered of a printed circuit board by binding the active copper surface through multiple soldering operations.

A need exists for such a preflux composition which is site specific, eliminating the need to clean the entire board if components are present which cannot be washed.

A need also exists for such a preflux composition which can be applied in a single step and which also does not require a drying step.

A need also exists for such a preflux composition which effectively protects surfaces to be soldered during vapor phase operations for which rosin prefluxes are unsuitable.

The present invention has as its object to provide a site-specific water soluble preflux which is effective to protect surfaces to be soldered and maintain solderability of printed circuit boards during multi-step assembly procedures without additional preclean/surface inhibition processing of the partially assembled card, which would corrode the assembly. The presently known preflux compositions are degraded after one assembly step and must be re-applied.

Another object of the invention is to provide such a preflux which is completely water soluble, allowing it to be easily cleaned without the use of organic solvents.

Another object of the invention is to provide such a soldering preflux which is environmentally superior, requiring no chemical reclamation or waste treatment.

Another object of the invention is to provide such a preflux which provides the needed degree of oxide removal from the surface to be soldered while forming inert reaction products after reflow which do not necessitate immediate removal.

Another object of the invention is to provide a preflux composition suitable to protect surfaces to be soldered which can be applied as a single component in a single step and which is useable during vapor phase operations.

Another object of the invention is to provide a unique preflux composition which will remove both halide and metal ions from the surface to be soldered, enhancing the reliability of very fine pitch (<0.020") components. Gel shrinkage during processing encapsulates the surface debris, which is subsequently removed during cleaning.

Another object of the invention is to provide such a soldering preflux which maintains solderability through multiple soldering operations, removing the need for highly activated and corrosive fluxes during subsequent soldering operations, thereby increasing yield.

SUMMARY OF THE INVENTION

The water soluble prefluxes of the invention are heat resistant aqueous gels which contain an oxidation inhibitor which is effective to prevent oxidation of the surface to be soldered of a printed circuit board. The preflux compositions are formulated by combining about 1 to 5% by weight, based on the total weight of the preflux, of a water soluble polymer as a carrier and from about 1 to 5% by weight of an organic activator which serves as an oxidation inhibitor, the remainder of the composition being water. The water soluble polymer is preferably selected from the group consisting of naturally occurring resins and substituted polysaccharides. A particularly preferred water soluble polymer is acacia gum. The organic activator is preferably selected from the group consisting of EDTA and citric acid.

The method of the invention is used to join a plurality of electronic components to a printed circuit board having surfaces to be soldered. A metallic solder is applied to at least one of the electronic components and surface regions to be joined. The selected component and surface region are contacted and heated to a temperature above the melting point of the metallic solder, followed by cooling of the component and surface region to a temperature below the melting point of the metallic solder to thereby join the electronic component to the surface. The preflux composition of the invention is applied to other of the surfaces to be soldered on the printed circuit board not having electronic components joined thereto either before or after the initial component installation step. The preflux composition can optionally be washed from the other regions and, thereafter, additional electronic components can be joined to the surfaces to be soldered. The preflux composition maintains solderability and protects against surface degradation due to oxidation and contaminant diffusion through multiple reflows.

The above as well as additional objects, features, and advantages of the invention will become apparent in the following detailed description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
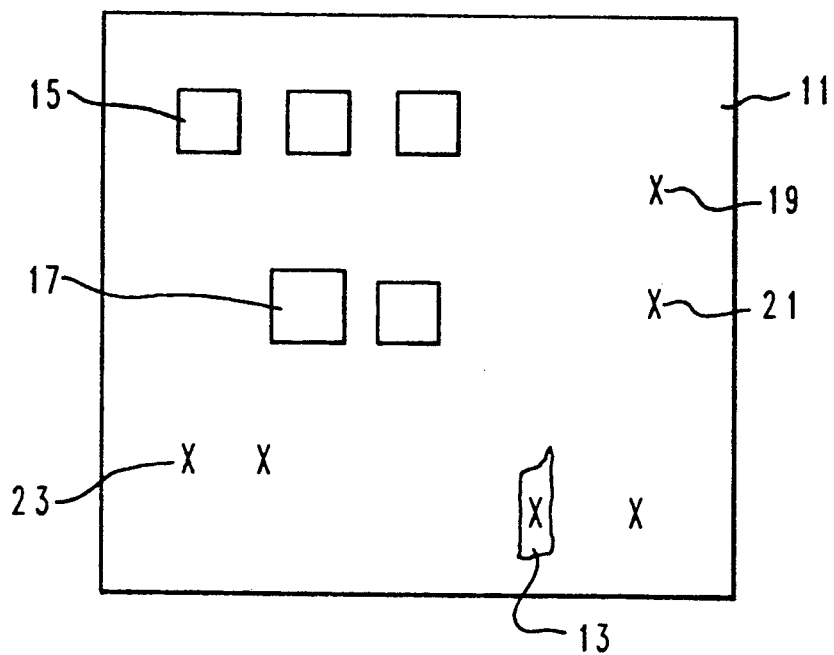
FIG. 1 is a simplified, schematic view of a printed circuit board showing the first step in the installation of electronic components thereon.

The water soluble soldering preflux compositions of the invention comprise (1) from about 1 to 5% by weight, based on the total weight of the preflux, of a water soluble polymer as a carrier; (2) from about 1 to 5% by weight of an oxidation inhibitor which is effective to prevent oxidation of the conductive copper surface regions of the printed circuit board being treated; and (3) the remainder being water.

A number of natural and synthetic polymers can be used to form the preflux carrier. Preferably, the water soluble polymer used as the carrier of the invention is selected from the group consisting of natural resins and gums. By way of example, the carrier can be selected from the group consisting of acacia gum, polysaccharides, substituted polysaccharides such as hydroxypropyl substituted polysaccharides, and the like.

A preferred carrier, acacia gum is a filtered, natural resin. The gum is a highly branched polymer of galactose, with rhamnose, arabinose and glucoronic acid as calcium, magnesium and potassium salts. It is soluble in cold or hot water and produces a viscous solution which inhibits minimal spreading when heated to reflow temperatures, with good stability under storage and a pseudo plastic rheology that resists separation and enhances the application properties.

The *Merck Index*, Merck and Company, 6th Edition, 1952, page 4, states that gum arabic or acacia gum has a molecular weight of about 240,000 and a specific gravity of about 1.35 to 1.49. The moisture content usually varies from about 13 to 15%. Gum arabic is insoluble in alcohol but is extremely soluble in water. Gum arabic is commercially available from a number of sources.

The gum arabic component is preferably employed in the compositions of the present invention in amounts from about 1 to 5% by weight of the soldering preflux composition, most preferably about 1 to 3% by weight of the total soldering preflux composition.

Other carrier materials include polysaccharides and substituted polysaccharides such as the C3-443 polysaccharide available commercially from the A. E. Staley Company. The polysaccharide component is preferably employed in the compositions of the present invention in amounts of about 0.2 to 5% by weight, most preferably about 0.2 to 1.0% by weight, based on the total weight of the soldering preflux composition.

The compositions of the present invention also include an oxidation inhibitor which is effective to prevent oxidation of the surfaces to be soldered by binding to the surface. The inhibitor is preferably ephemeral in nature, completely dissipating when heated in the range of about 200° C. and above. Preferred inhibitors include aliphatic carboxylic acids having from about 5 to 10 carbon atoms, e.g., citric acid, ethylene diamine tetraacetic acid (EDTA) and/or diethylene triamine pentaacetic acid and/or salts thereof.

A preferred inhibitor, citric acid is widely distributed in plants and in animal tissues and fluids. It is produced by mycological fermentation on an industrial scale using crude sugar solutions and is commercially available from a number of sources. It is preferably present in the soldering preflux composition of the invention in the range from about 1 to 5% by weight.

The ethylene diamine tetraacetic acid (EDTA) inhibitor component is a commercially available white powder having an apparent density of 5 pounds per gallon of volume and is very soluble in water. The pH of a 1% solution is approximately 11.8. It reacts with most metallic ions to form soluble non-ionic metal chelate compounds. The EDTA component is preferably present in the preflux compositions of the invention in the range from about 1 to 5% by weight.

In the preflux compositions utilizing a polysaccharide component as the carrier, an acetylenic diol can also be employed with the citric acid inhibitor. The acetylenic diol is preferably present in the range from about 0.1 to 1% by weight with the citric acid component being present in the range from about 2 to 5% by weight.

The remainder of the soldering preflux composition of the invention is preferably deionized water. An organic solvent or diluent is not utilized, thereby contributing to the non-toxic, environmentally preferred characteristics of the inventive compositions. The water component of the compositions will be preferably be present in the range from about 90 to 96% by weight based on the total weight of the preflux composition.

The following non-limiting examples are intended to further illustrate the present invention:

EXAMPLE 1

| WEIGHT PERCENT | COMPONENT |
| --- | --- |
| 1-5 | acacia gum |
| 1-5 | EDTA |
| remainder | deionized water |

EXAMPLE 2

| WEIGHT PERCENT | COMPONENT |
| --- | --- |
| 1-5 | acacia gum |
| 1-5 | citric acid |
| remainder | deionized water |

EXAMPLE 3

| WEIGHT PERCENT | COMPONENT |
| --- | --- |
| 0.2-1.0 | polysaccharide |
| 0.1-1.0 | acetylenic diol (SURFYNOL 82) |
| 1-5 | citric acid |
| remainder | deionized water |

The soldering flux of Examples 1 and 2 was prepared by heating the deionized water to approximately 50° C. followed by stirring in the acacia gum until the gum was dissolved. The composition was removed from the heat source to cool to room temperature and the EDTA/citric acid was added with the composition being stirred until the components were dissolved.

The composition of Example 3 was prepared by heating the deionized water to 50° C. and adding the polysaccharide while stirring. After the polysaccharide dissolved, the acetylenic diol was added with stirring until the component was dissolved. The composition was removed from the source of heat and cooled while stirring in the citric acid component.

FIG. 1 shows a printed circuit board 11 having surfaces to be soldered 13 for joining a plurality of electronic components 15, 17, etc. In the schematic illustration of FIG. 1, a number of components 15, 17 have been attached by soldering to the surface regions 13 of the board 11, with additional sites 19, 21, 23, etc. being available for attachment of additional electronic components in subsequent steps.

The components 15, 17 are joined to the board 11 by applying a metallic solder to at least one of the electronic component and surface region to be joined, the component and surface being contacted and heated to a temperature above the melting point of the metallic solder. Thereafter, the component and surface region are cooled to a temperature below the melting point of the metallic solder to thereby join the electronic component to the copper surface region.

Figure 2:
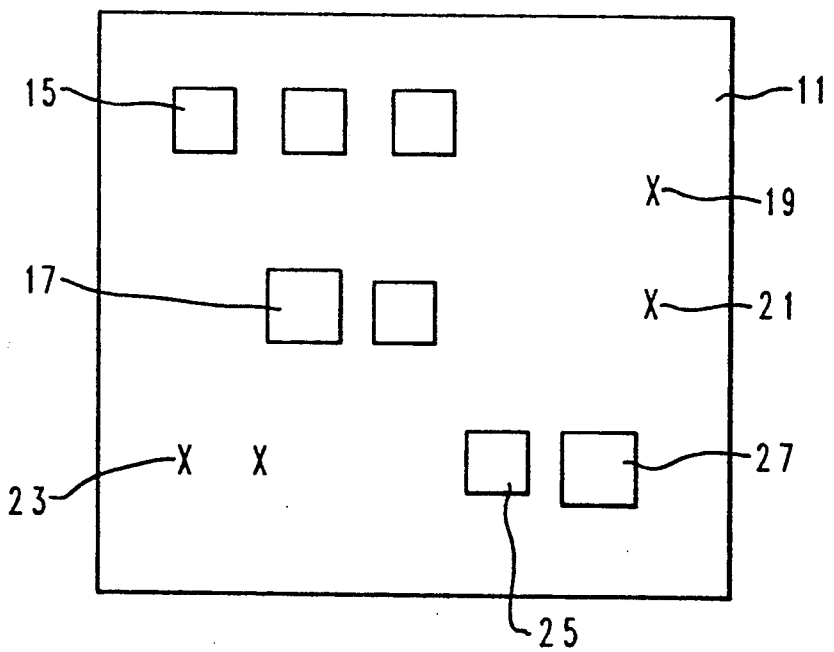
FIG. 2 is a view similar to FIG. 1 showing a subsequent installation step.

The additional sites 19, 21, 23, etc. can be protected from oxidation and contamination by coating with the preflux composition of the invention either prior to or subsequently to the previously described manufacturing steps. The application of the preflux composition of the invention prior to initial assembly step(s) prevents oxidation of the unoccupied sites and prevents contamination by flux in the initial assembly step(s). The preflux composition can be applied after the initial soldering step at the sites 15, 17, etc., to remove oxides from the conductive copper surface. FIG. 2 shows the subsequent attachment of additional electronic components 25, 27 at the previously unoccupied sites. The preflux can be removed by hot or cold water and does not require the use of organic solvents.

An invention has been provided with several advantages. The soldering preflux of the invention is provided as a water soluble medium which allows aqueous removal after solder reflow. Because the preflux can be easily cleaned without the use of organic solvents, a low toxicity preflux is provided. Corrosive materials such as halides are not utilized so that rapid and thorough preflux removal is not necessary. The preflux compositions prevent deterioration of circuitry and interconnections of the type produced by corrosive flux components. The primary components of the preflux compositions are natural products and their derivatives. The coating volume (thickness) of the compositions can be controlled by spraying or screening onto the target substrate. The preflux compositions will clean the site of metal ions, halide ions, and debris with aqueous cleaning. After aqueous cleaning, the surface will be solderable. The raw materials for the preflux compositions are relatively inexpensive and are commercially available. The preflux constituents are non-corrosive and halide free, presenting minimal risk to electronic components present on the board. The components of the preferred compositions are non-toxic, non-flammable and pose no waste water treatment or air pollution hazards. The prefluxes of the invention can be used without the necessity of a reducing or other special soldering atmosphere.

While the invention has been shown in only one of its forms, it is not thus limited but is susceptible to various changes and modifications without departing from the spirit thereof.

What is claimed is:

1. A method for joining a plurality of electronic components to a printed circuit board having surfaces to be soldered, the method comprising the steps of:

applying a preflux composition to selected ones of the surfaces on the printed circuit board to be soldered and not having electronic components joined thereto, the preflux composition comprising a heat resistant aqueous gel containing an oxidation inhibitor which is effective to prevent oxidation of the surfaces to be soldered; and applying a metallic solder to at least one of the electronic components and surface regions to be soldered, contacting the selected component and surface to be soldered and heating them to a temperature above the melting point of the metallic solder, followed by cooling the component and surface to a temperature below the melting point of the metallic solder to thereby join the electronic component to the surface.

2. The method of claim 1, wherein the preflux composition is formulated by combining from about 1 to 5% by weight, based on the total weight of the preflux, of a water soluble polymer as a carrier and from about 1 to 5% by weight of an oxidation inhibitor, the remainder being water.

3. The method of claim 2, wherein the water soluble polymer is selected from the group consisting of naturally occurring resins and substituted polysaccharides.

4. The method of claim 3, wherein the water soluble polymer is acacia gum.

5. The method of claim 4, wherein the oxidation inhibitor is selected from the group consisting of ethylene diamine tetraacetic acid and citric acid.

6. The method of claim 1, wherein additional electronic components are joined to other of the prefluxed surfaces in a succeeding step of the method, the initially soldered electronic component and surface having cooled prior to the additional electronic components being joined.

7. A method for joining a plurality of electronic components to a printed circuit board having surfaces to be soldered, the method comprising the steps of:

applying a preflux composition to selected ones of the surfaces on the printed circuit board to be soldered and not having electronic components joined thereto, the preflux composition comprising a heat resistant aqueous gel containing an oxidation inhibitor which is effective to prevent oxidation of the surfaces to be soldered;

in an initial process step, applying a metallic solder to at least one of the electronic components and surface regions to be soldered, contacting the selected component and surface to be soldered and heating them to a temperature above the melting point of the metallic solder, followed by cooling the component and surface to a temperature below the melting point of the metallic solder to thereby join the electronic component to the surface;

washing off the preflux composition and any flux residue resulting from the initial process step from selected surfaces not having electronic components joined thereto;

reapplying a preflux composition to selected surfaces on the printed circuit board not having electronic components joined thereto; and thereafter, joining additional electronic components to the prefluxed surfaces.

8. The method of claim 7, wherein the preflux composition is formulated without the presence of halogen components and is completely soluble in an aqueous solution, thereby rendering it inflammable and allowing it to be cleaned from the printed circuit board by aqueous wash without the use of organic solvents.

9. The method of claim 8, wherein the preflux composition is formulated by combining from about 1 to 5% by weight, based on the total weight of the preflux, of a water soluble polymer as a carrier and from about 1 to 5% by weight of an oxidation inhibitor, the remainder being water.

10. The method of claim 9, wherein the water soluble polymer is selected from the group consisting of naturally occurring resins an substituted polysaccharides.

11. The method of claim 10, wherein the water soluble polymer is acacia gum.

12. The method of claim 11, wherein the oxidation inhibitor is selected from the group consisting of ethylene diamine tetraacetic acid an citric acid.

* * * * *

UNITED STATES PATENT AND TRADEMARK OFFICE
CERTIFICATE OF CORRECTION

PATENT NO. : 5,127,571

DATED : July 7, 1992

INVENTOR(S) : Guiterrez et al

It is certified that error appears in the above-identified patent and that said Letters Patent is hereby corrected as shown below:

Column 8, line 27, "an" should be --and--.

Signed and Sealed this

Twenty-second Day of December, 1992

*Attest:*

DOUGLAS B. COMER

*Attesting Officer*      *Acting Commissioner of Patents and Trademarks*